United States Patent [19]
Caranhac et al.

[11] Patent Number: 6,091,092
[45] Date of Patent: Jul. 18, 2000

[54] DRIVING-GATE CHARGE-COUPLED DEVICE

[75] Inventors: Sophie Caranhac, Grenoble; Yves Thenoz, Luaix en Chartreuse, both of France

[73] Assignee: Thomson-CSF Semiconducteurs Specifiques, Paris, France

[21] Appl. No.: 08/373,237
[22] PCT Filed: May 3, 1994
[86] PCT No.: PCT/FR94/00506
 § 371 Date: Jan. 5, 1995
 § 102(e) Date: Jan. 5, 1995
[87] PCT Pub. No.: WO94/27322
 PCT Pub. Date: Nov. 24, 1994

[30] Foreign Application Priority Data

May 7, 1993 [FR] France .................................. 93 05517

[51] Int. Cl.⁷ .................... H01L 27/148; H01L 29/768
[52] U.S. Cl. ...................... 257/243; 257/240; 257/241; 257/225; 257/249
[58] Field of Search ................................. 257/240, 241, 257/243, 249, 250, 448, 457, 459, 465

[56] References Cited

U.S. PATENT DOCUMENTS

| | | | |
|---|---|---|---|
| 3,995,302 | 11/1976 | Amelio | 257/500 |
| 4,839,911 | 6/1989 | Boucharlat | 257/240 |
| 5,182,622 | 1/1993 | Iizuka et al. | 257/249 |
| 5,239,192 | 8/1993 | Hirota | 257/243 |
| 5,286,989 | 2/1994 | Yonemoto | 257/243 |
| 5,365,093 | 11/1994 | Kund | 257/249 |

FOREIGN PATENT DOCUMENTS

| | | |
|---|---|---|
| 62-296463 | 12/1987 | European Pat. Off. . |
| 0333260 | 9/1989 | European Pat. Off. . |
| 0457192 | 11/1991 | European Pat. Off. . |
| 60257574 | 12/1985 | Japan . |
| 61-3194870 | 8/1986 | Japan . |
| 61-289665 | 12/1986 | Japan .................................. 257/240 |
| 2-271541 | 11/1990 | Japan .................................. 257/240 |
| 2-303135 | 12/1990 | Japan .................................. 257/240 |
| 3-116841 | 5/1991 | Japan .................................. 257/240 |
| 9103838 | 3/1991 | WIPO . |

*Primary Examiner*—Mahshid Saadat
*Assistant Examiner*—Jesse A. Fenty
*Attorney, Agent, or Firm*—Oblon, Spivak, McClelland, Maier & Neustadt, P.C.

[57] ABSTRACT

The invention relates to a charge-coupled device. Such devices comprise at least one insulated conducting gate (3) connecting two semiconductor zones. According to the invention, each insulated conducting gate (3) has a width progressively increasing from the first semiconductor zone (1) to the second semiconductor zone (2). The width of each gate (3) is sufficiently narrow for the potential well created by the application of a voltage V to the gate to have a depth increasing progressively from the first zone (1) to the second zone (2), thus enabling the charges to be driven away. The invention applies to any type of charge-coupled device and particularly to photodiodes.

8 Claims, 5 Drawing Sheets

DRIVING-GATE CHARGE-COUPLED DEVICE

This application is a 371 of PCT/FR94/00506 May 3, 1994.

FIELD OF THE INVENTION

The present invention relates to a charge-coupled device.

The invention will be more particularly described for the production of large-sized photodiodes coupled to charge-reading registers, but it also relates more generally to any type of charge-coupled device.

BACKGROUND OF THE INVENTION

Large-sized photodiodes are intended to provide low-illumination signals.

According to the prior art, the charges created in large-sized photodiodes can be completely driven to the read register only if a charge background, called the driving charge, in injected into the diode.

This driving charge is then transferred and read at the same time as the useful signal created by the photodiode. Such a system has many drawbacks. Over and above the fact that it requires a charge injection device, it decreases the output dynamics by increasing the noise level.

The invention does not have these drawbacks.

SUMMARY OF THE INVENTION

The subject of the present invention is a photodiode comprising a photosensitive zone enabling charges to be generated under the effect of light and of a storage gate intended to store the charges thus generated, characterized in that it comprises means for draining away the charges to the storage gate. These means are mainly produced by narrow gates of varying width and electrically connected to the storage gate, the widening of which is progressive on moving closer to the storage gate. Under the effect of a DC voltage applied to the gates, a potential well of increasing depth appears beneath each gate, enabling the electrons created in the photosensitive zone to be collected and drained away to the storage gate.

An advantage of the invention consists therefore in improving the electrical performance of large-sized photo-electric diodes.

More generally, the invention also relates to a charge-coupled device comprising a semiconductor substrate and means for draining away charges from a first semiconductor zone to a second semiconductor zone on the substrate, these means including at least one insulated conducting gate connecting the two semiconductor areas and raised to a potential sufficient to create a potential well in the semiconductor substrate, characterized in that the insulated gate has a width progressively increasing from the first zone to the second zone, this width being sufficiently narrow for the potential well to have a depth progressively increasing from the first area to the second area.

BRIEF DESCRIPTION OF THE DRAWING

Other characteristics and advantages of the invention will appear on reading about the embodiments made with reference to the herein appended figures in which.

In all the figures, the same references designate the same elements.

DETAILED DESCRIPTION OF THE INVENTION

Figure 1:
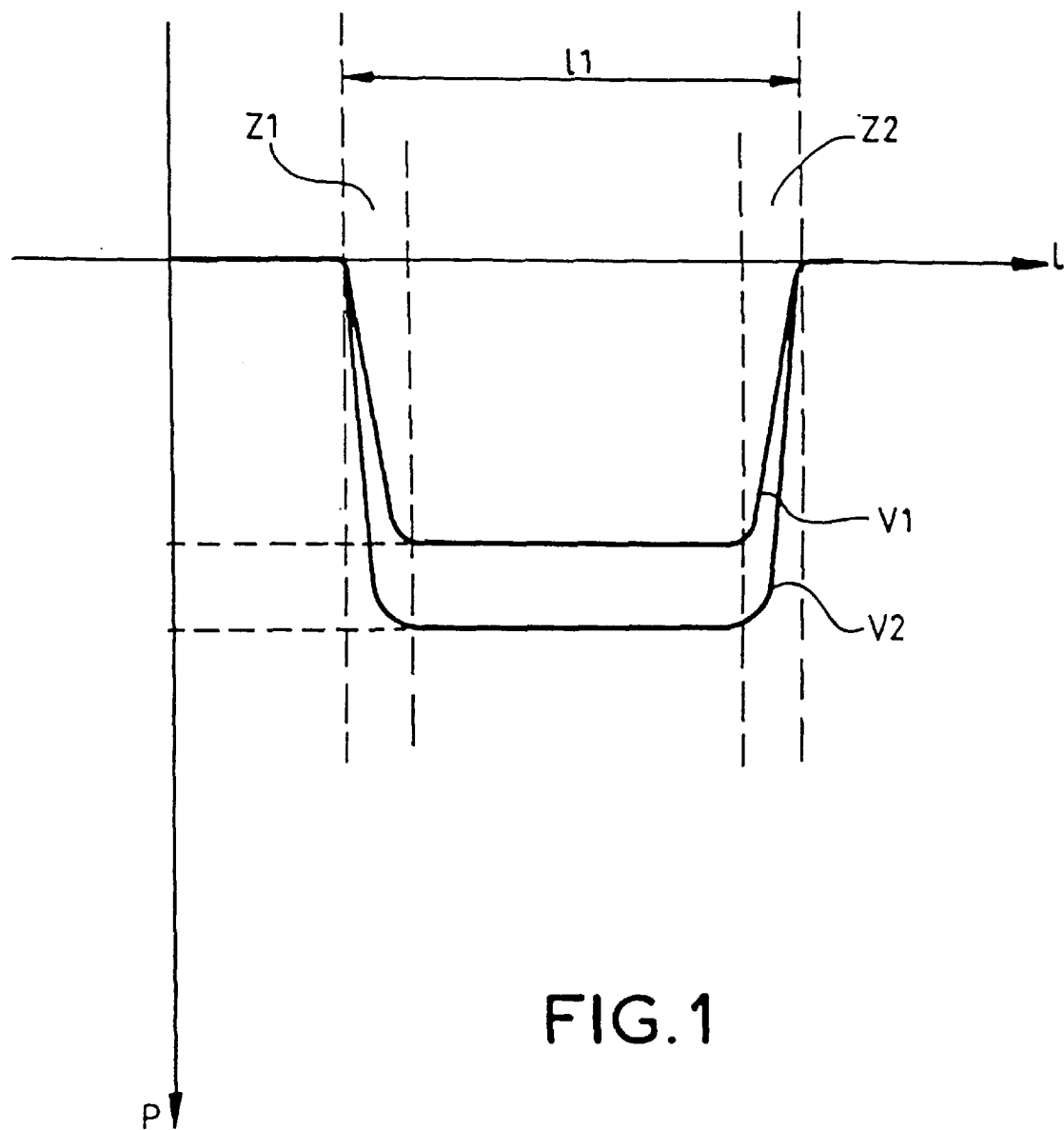
FIG. 1 represents the potential well existing beneath an insulated gate for two different values of the voltage applied to the gate.

FIG. 1 represents the potential well existing beneath an insulated gate of width L1, for two different values (V1, V2) of the voltage applied to the gate.

A first curve C1 corresponds to a voltage V1 and a second curve C2 corresponds to a voltage V2 greater than V1. As is known to the person skilled in the art, the potential well P deepens as the applied voltage is increased.

These potential wells are uniform over the entire width of the gate except in the transition zones Z1, Z2 located on the edges of the gate, since the potential well does not reach its value immediately.

Figure 2:
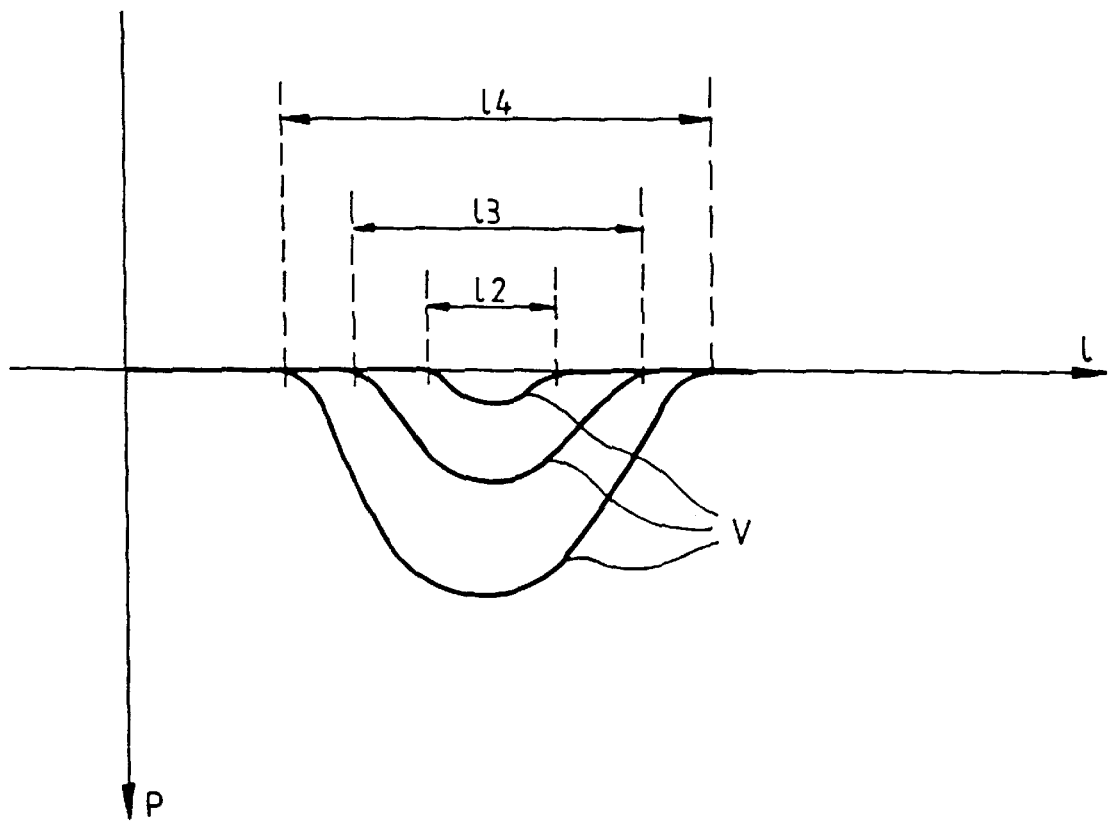
FIG. 2 represents the potential wells existing beneath three narrow insulated gates of different widths, for the same value of the voltage applied to the gate.

FIG. 2 represents the potential wells existing beneath three narrow gates of different widths (L2, L3, L4), for a first value (V) of the voltage applied to the gate.

The widths L2, L3, L4 of the gates are of the order of magnitude of the transition zones Z1, Z2 mentioned previously. Since the width 14 is greater than the width L3, which is itself greater than the width L2, the potential well created by the gate of width L4 is deeper than the potential well created by the gate of width L3, the latter well being deeper than the potential well created by the gate of width L2. Therefore, for the same value of voltage applied to the gates, the potential wells have greater depths as the gate widens. In this case, it is possible to obtain a potential difference of a few volts along a gate of continuously enlarging narrow width and to which gate a voltage V is applied.

Figure 3:
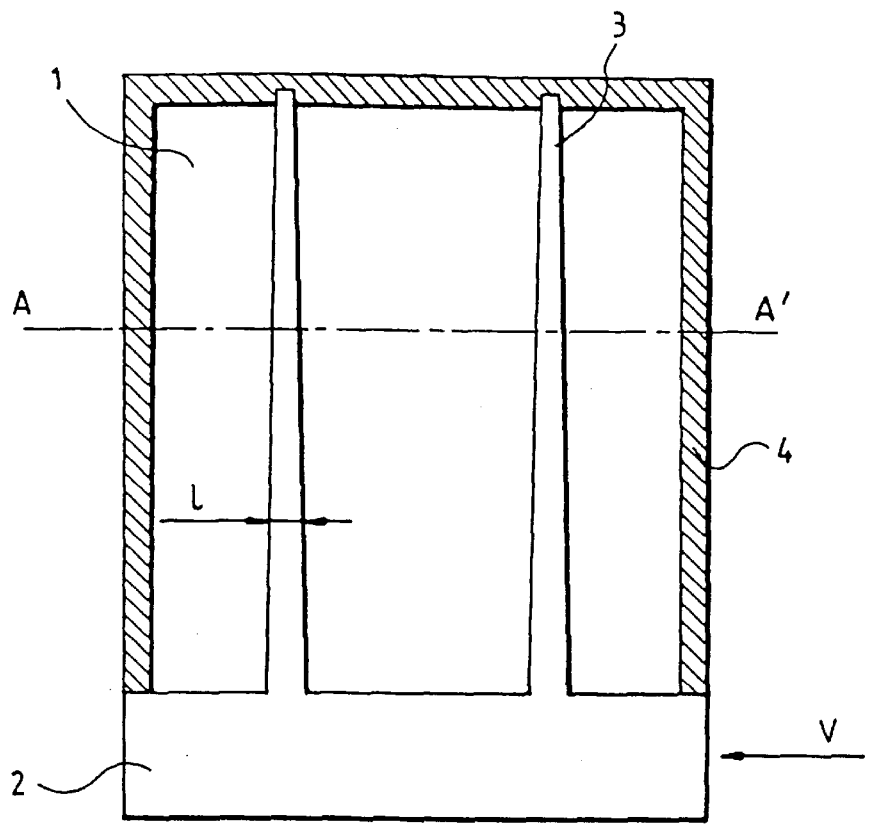
FIG. 3 represents a photodiode according to a first embodiment of the invention.

FIG. 3 represents the view from above of a photodiode according to a first embodiment of the invention.

This photodiode consists of a photosensitive zone 1 and a non-photosensitive lateral storage gate 2. The photosensitive zone 1 is of the type having a low remainance and will be more particularly described in FIG. 4. According to the invention, the storage gate 2 is electrically connected to gates 3 enabling the electrons generated in the photosensitive zone, far from the storage gate 2, to be collected and drained away to the storage gate.

Each drainage gate 3 widens, preferably continuously, from the end opposite the storage gate to the zone where contact with the storage gate takes place. This widening is calculated so that, beneath the gate 3 and under the action of the external voltage V applied to the gate, a potential well is created whose depth increases and varies from a few volts, for example 2 to 3 volts, between the end of the gate 3 remote from the storage gate and the end of the gate 3 which is in contact with the storage gate. The electrons which are not generated near the storage gate 2 are then driven by the latter via the closest gate 3. According to one embodiment of the invention, the width L of the gate 3 is of the order of 2 microns at the end opposite the storage gate 2 and of the order of 3.5 microns at the place where contact with the said storage gate takes place. However, other values are possible.

The values chosen must then be compatible with the desired deepening of the potential well.

FIG. 3 represents two electron drainage gates. However, the invention relates to photodiodes which include a different number of drainage gates 3. In general, the number of drainage gates is related to the total surface area of the photosensitive zone 1 and to the amount of light which it is desired to detect.

According to the preferred embodiment of the invention, the two drainage gates are approximately 40 microns apart, this corresponding to a drainage of electrons over approximately 20 microns.

The photodiode comprises, on the periphery which is not contiguous with the storage gate 2, an isolation zone 4. This zone serves to isolate the photosensitive zones when several photodiodes are placed side by side. The zone 4 is produced, for example, by direct implantation of boron into the substrate P, without the presence of the n-doped layer which is found in the rest of the photosensitive zone.

Figure 4:
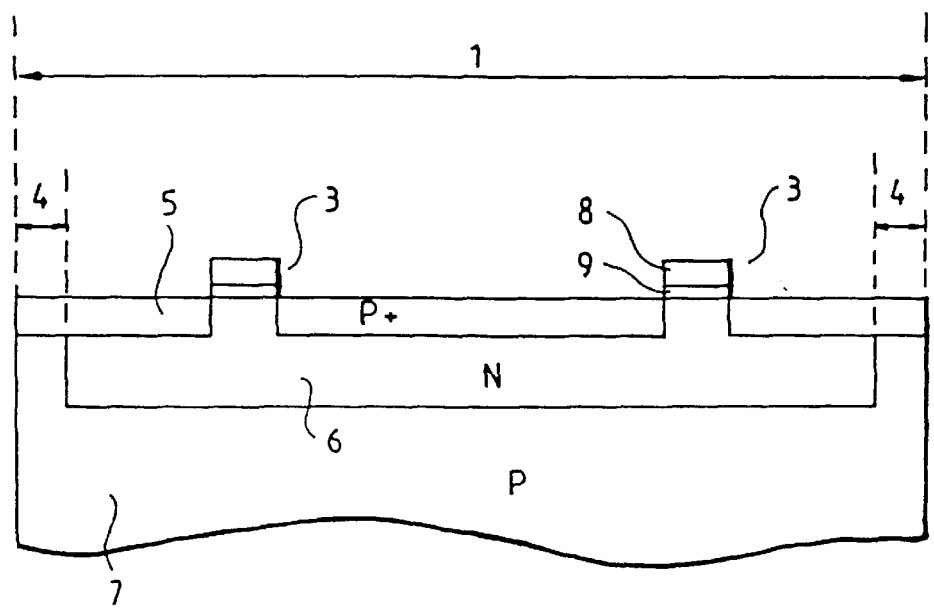
FIG. 4 represents a detailed sectional view of FIG. 3.

FIG. 4 represents a detailed sectional view of FIG. 3. This sectional view enables the photoelectric diode according to the invention to be represented in thickness, along the axis AA' of FIG. 3.

The photodiode according to the invention is of the low-remainance type. As is known to the person skilled in the art, the photosensitive zone consists of a highly p-doped thin layer deposited on an n-doped layer which itself covers a p-doped substrate. Therefore, outside the part covered by the drainage gates 3, the photodiode of the invention consists of a highly p-doped thin layer 5 ($p^+$) deposited on an n-doped layer 6 which itself covers a p-doped substrate 7.

According to the invention, the zone covered by a drainage gate 3 does not have the highly p-doped layer 5 so as to permit creation of the potential well which enables the electrons to be drained away.

Each drainage gate 3 preferably consists of a polycrystalline silicon layer 8 deposited on an insulator layer 9. According to the preferred embodiment, each drainage gate 3 is photosensitive.

As was mentioned previously, the photodiode comprises, on the periphery which is not contiguous with the storage gate 2, an isolation zone 4 which does not have an n layer.

According to the embodiment described, the drainage gates 3 are perpendicular to the storage gate 2. The invention also relates to other configurations which may turn out to be more suitable for draining away the electrons to the storage gate.

Figure 5:
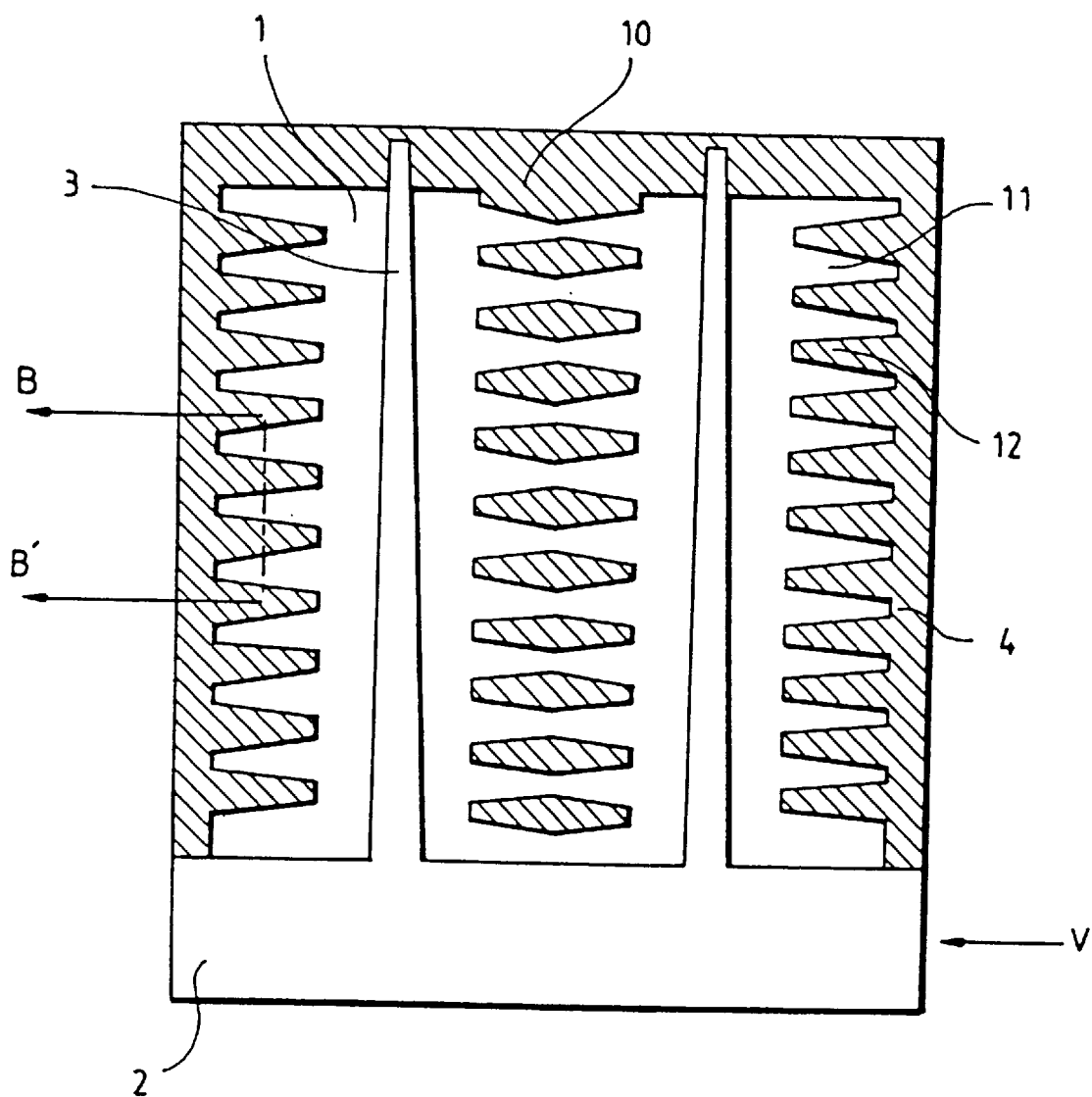
FIG. 5 represents a photodiode according to the preferred embodiment of the invention.

FIG. 5 represents a photodiode according to the preferred embodiment of the invention. According to this embodiment, the geometry of the photosensitive zone 1 is cut up so as to promote the travel of the electrons to the drainage gates 3. For this purpose, the photosensitive zone does not have an n-doped layer throughout part of its volume. This zone devoid of an n layer is shown hatched and referenced as 10 in FIG. 10.

The n-doped layer is in the form of a set of channels 11 of axes perpendicular to the axis of the drainage gates 3 and separated by non-n-doped barriers 12. Each channel widens continuously towards a drainage gate 3. This widening is preferentially calculated so that the threshold voltage of the diode, which the $p^+$-n junction represents, hollows out a slight potential well, the accentuation of which enables the electrons present in the channels 11 to be driven towards the drainage gates 3. The electrons generated in the barriers 12 tend to slip away towards the channels 11 and thus contribute to the flux of electrons drained away by the channels 11. The set of channels 11 therefore constitutes an additional means making it possible to facilitate access for the electrons to the drainage gates 3.

According to the preferred embodiment, this same drainage gate is surrounded by two subsets of channels 11, as represented in FIG. 5.

The photodiode represented in FIG. 5 represents two drainage gates 3. As was mentioned previously, the invention also relates to photodiodes which include a different number of drainage gates.

In the devices which use these photodiodes, such as charge-coupled devices, several photodiodes are placed side by side. It is then necessary to insulate the photosensitive zones from each other. The perimeter 4 of the zone 10 which does not have an n layer provides this, as was described previously.

Figure 6:
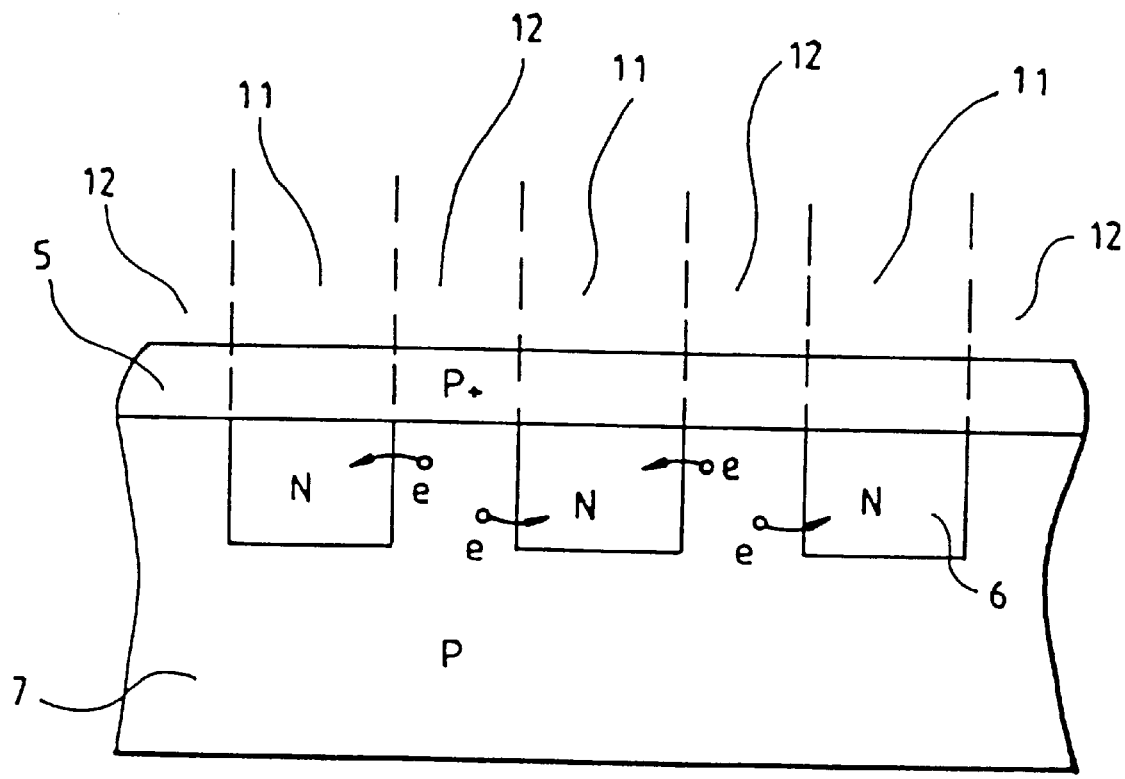
FIG. 6 represents a detailed sectional view of FIG. 5.

FIG. 6 represents a detailed sectional view of FIG. 5. The section is made along the axis BB' of FIG. 5.

Along this axis, the photosensitive zone 1 consists of a regular alternation of channels 11 and barriers 12.

Each channel 11 consists of a stack of a highly p-doped layer 5 deposited on an n-doped layer 6 which itself covers a p-doped substrate 7.

Each barrier 12, devoid of an n layer, consists of the layer 5 and the substrate 7. The electrons e generated in the p zone are symbolically represented as flowing out into the nearest n zone.

The invention has just been described for the production of a photodiode. However, as was mentioned earlier, it also relates to any type of device enabling charges to be transferred from a first semiconductor zone to a second semiconductor zone. Such charge-coupled devices then comprise at least one insulated conducting gate extending between the two semiconductor zones. Each gate has a width progressively increasing from the first zone to the second zone. The width of each gate is then sufficiently narrow for the potential well created by the application of a voltage V to the gate to have a depth progressively increasing from the first zone to the second zone, thus enabling the charges to be driven away.

What is claimed is:

1. A photosensitive device, comprising:
    a non-photosensitive storage region,
    at least one photosensitive region adjacent to said non-photosensitive storage region, said photosensitive region having a first portion adjacent to said storage region and a second portion remote from said storage region, wherein said storage region receives charges created in said photosensitive region during illumination thereof, and
    a drainage device located within said photosensitive second portion, wherein said drainage device drains towards said storage region charges created in said second portion during illumination, said drainage device including a potential well having a continuously varying depth.

2. The photosensitive device according to claim 1, wherein said drainage device includes at least one drainage gate configured to form said potential well beneath said drainage gate, each drainage gate having a width which increases progressively towards said storage region, said width being narrow enough so that the depth of said potential well depends from said width.

3. The photosensitive device according to claim 2, wherein a storage gate is provided above said storage region and said at least one drainage gate is electrically connected to said storage gate.

4. The photosensitive device according to claim 2, wherein said at least one drainage gate comprises a polycrystalline silicon layer deposited on an insulating layer.

5. The photosensitive device according to claim 2, comprising a P silicon substrate, wherein said photosensitive region comprises an N doped well formed in said P substrate, and a P+ superficial region above said N doped well, said P+ region being absent beneath said at least one drainage gate.

6. The photosensitive device according to claim 5, wherein said N doped well in said photosensitive region comprises a set of channel portions oriented perpendicular to said at least one drainage gate, said channel portions separated by portions of said P substrate for helping transfer of charges towards said potential well beneath said at least one drainage gate.

7. The photosensitive device according to claim 6, wherein said channel portions include a widening portion towards said at least one drainage gate.

8. The photosensitive device according to claim 5, wherein said N doped well is surrounded by an isolation P zone where said photosensitive region is not adjacent to said storage region.

* * * * *